331-98
SEARCH ROOM

INVENTOR.
G. David Faulkner
BY
Blair & Buckles
ATTORNEYS.

INVENTOR.
G. David Faulkner
BY
Blair & Buckles
ATTORNEYS.

United States Patent Office 3,259,853
Patented July 5, 1966

3,259,853

MICROWAVE OSCILLATOR WITH VARIABLE BI-METALLIC FREQUENCY STABILIZER

George D. Faulkner, Tampa, Fla., assignor to Trak Microwave Corporation, Tampa, Fla.

Filed May 13, 1963, Ser. No. 280,057
10 Claims. (Cl. 331—98)

This invention relates to apparatus for maintaining constant the frequency of microwave electronic devices. More particularly the invention relates to apparatus for maintaining constant the frequency of electronic devices such as a transmitting oscillator wherein distributed capacitances and inductances vary with changes in temperature and wherein such temperature changes are controlled and compensated for to maintain the oscillator frequency within predetermined limits.

Many electronic radar and communication devices used in high performance aircraft, missiles, and space craft operate in the microwave region of the frequency spectrum. In order to generate such high frequencies, the small inductances and capacitances of distributed parameter circuits, such as transmission lines, are used. The frequency of an oscillator, for example, is determined by the capacitance and inductance of its resonant circuit or circuits, and for microwave frequencies these values must be very small. Thus in such oscillators the resonant circuits utilize distributive inter-electrode capacitance and inductance. As with transmission line conductors, slight changes in spatial relationship between the elements of a radio frequency tube greatly affects the output frequency.

Such problems are particularly acute in missiles and spacecraft which rely upon such microwave electronic components for guidance and range determinations. A principal factor in changing spatial relationships in devices such as oscillators is temperature, and yet with the space and weight limitations for missiles and space craft the amount of electronic air conditioning provided must be quite limited. In general the body of the missile or space craft itself is used as a heat sink with heat being conducted to it from the electronic components for dissipation by radiation therefrom.

The docking or landing of space craft, for example, requires extremely high resolution radar. The output frequency of a transmitting oscillator for such a radar must therefore be closely controlled over a substantial range of operating temperatures.

In transmitting oscillators the heat generated by the tube plate current is by far the most difficult to handle, and if not dissipated and/or compensated for, this heat causes intolerable variations in output frequency from the oscillator. Thus the extremes of ambient temperature at which the oscillator must operate poses a serious problem in maintaining output frequencies within proper limits. The heat generated by heavy plate current and the rate at which it is removed from the oscillator are key factors in maintaining the proper frequency. Temperature compensating bimetallic strips may be positioned within the oscillator shell to counteract the effects of heat, but heretofore these temperature compensators have not been adjustable once the oscillator is assembled.

Accordingly it is an object of the present invention to provide means for automatically controlling the frequency of microwave electronic devices within predetermined limits;

Another object of the invention is to provide apparatus of the above character wherein the heat generated in such an electronic device is efficiently conducted away from the device without affecting its performance;

A further object of the invention is to provide apparatus of the above character wherein temperature increases during operation are compensated for to maintain the frequency of the device within predetermined limits;

Another object of the invention is to provide apparatus of the above character in which the temperature compensating means is variable from outside the electronic device.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

Like reference characters denote like parts throughout the several views of the drawings.

Figures 1, 2, 8:
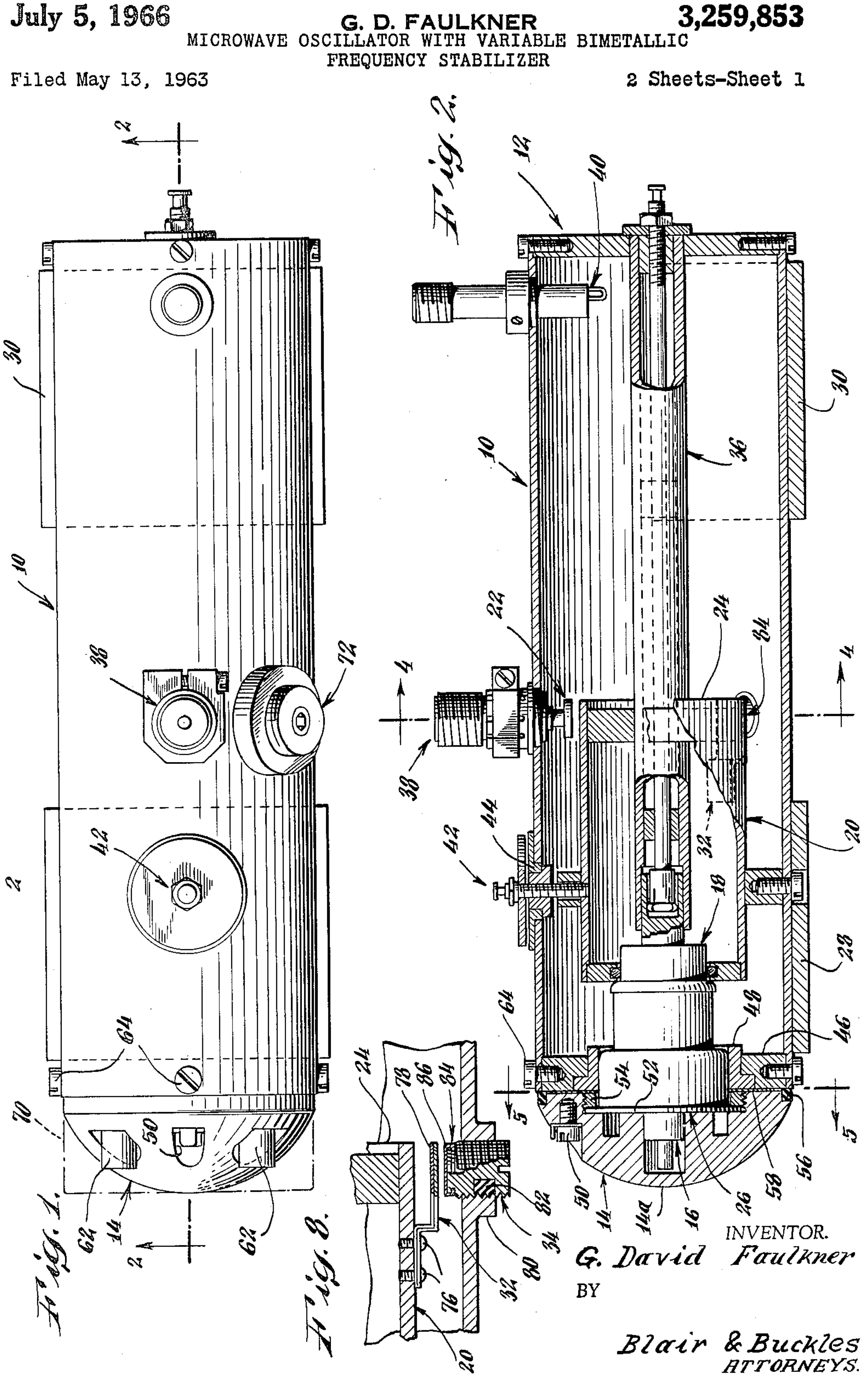
FIGURE 1 is a top view of a transmitting oscillator employing the invention.
FIGURE 2 is a side view in partial section taken along lines 2—2 of FIGURE 1.
FIGURE 8 is a partial side view in section taken along lines 8—8 of FIGURE 4 looking in the direction of the arrows.

As shown in FIGURES 1 and 2, the transmitting oscillator is contained by tubular body shell 10 having an end plate 12 and an end cap 14 which receives the anode end 16 of a microwave triode tube 18 having an axially extending grid sleeve 20. The output probe 22 is closely coupled to the free end 24 of the grid sleeve.

In such a transmitting oscillator, the plate connection 26 carries a relatively high amount of current and consequently the plate temperature and the closely surrounding elements become heated in operation. Since the oscillator is dependent upon the distributed capacitance and inductance of the triode 18 and of the other components within the tubular body 10, this heat must be dissipated as quickly and as uniformly as possible. Any excessive build-up of heat during operation causes expansion of components with the subsequent change of spatial relationship and consequently a change of distributed capacitance and inductance for the tuned circuits of the oscillator, resulting in intolerable changes in output frequency. The problem is further compounded because the anode end cap 14 must be electrically insulated from the body 10 of the oscillator at frequencies well below radio frequency.

The end cap 14 conducts heat from the tube anode through the tubular body 10 to the mounting feet 28–30 and then to the body of the space craft which acts as a heat sink while radiating heat into space.

Figure 4:
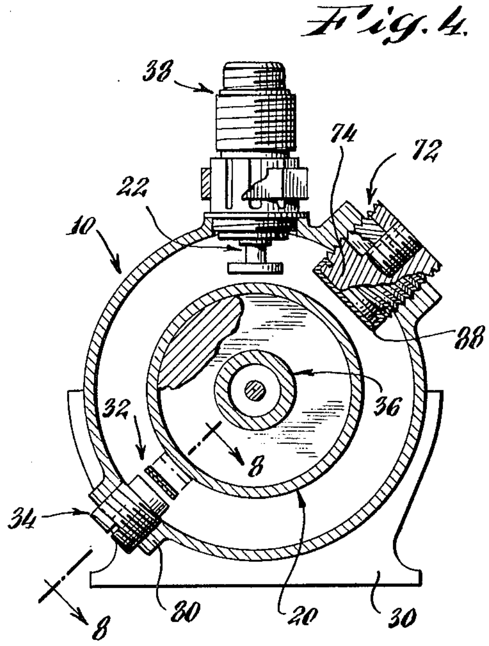
FIGURE 4 is an enlarged end view in section taken along lines 4—4 of FIGURE 2 looking in the direction of the arrows.

Since the oscillator still must operate within a wide range of temperatures, compensating changes in distributed inductance and capacitance within the operating temperature range must also be provided for. Referring now to FIGURES 4 and 8, it will be seen that the grid sleeve 20 is provided with a bimetallic strip 32 adjacent end 24 for this purpose. As the oscillator is subjected to varying temperatures within its operating temperature range, the end 78 of bimetallic strip 32 will move toward and away from the grid sleeve 20 to compensate for changes in capacitance and inductance of the oscillator components, thus maintaining output frequency of the oscillator within tolerable limits. Heretofore bimetallic strips have been used for such purposes but they have not been tunable after the oscillator is assembled under operating conditions.

While experience and empirical data gives some indication of temperature factors to be designed into the oscillator, it is not always possible to predict with sufficient accuracy the effect of temperature that will be experienced by the oscillator in operation. Therefore, an exteriorly operable tuning element 34 is provided in the tubular shell 10 so that the output frequency of the oscillator can be finally adjusted for the temperatures to be encountered under actual operating conditions. Thus the oscillator may be operated under space conditions, with the heat dissipation factor through the end cap 14 being simulated as closely as possible. As the output frequency varies, the tuning element 34 is then adjusted to provide the optimum output frequency at the temperatures to be encountered under operating conditions.

The invention will now be described in more detail. Referring now to FIGURES 1 and 2, it will be seen that the tubular body 10 contains the tube 18 and the associated cylindrical elements such as the grid sleeve 20 and cathode line sub-assembly 36, all arranged coaxially within the tubular body. The output probe 22 is closely coupled with the end 24 of the grid sleeve and is connected to coaxial connector 38, for connection to an antenna or other load to which radio frequency energy is delivered. A second probe 40 for connection to a source of modulating signals is also positioned on the tubular body 10 and a grid by-pass connection 42 is secured to the body 10 through an insulator 44.

The tube 18 is centered in end plate 46 by insulating sleeve 48 and the anode terminal 26 is thus in contact with the cap 14 to which B+ voltage is applied through terminal connection 50. In operation an input circuit is formed between the cathode line sub-assembly 36 and the grid sleeve 20 and between the cathode line sub-assembly 36 and the tubular body 10 from the end 24 of the grid sleeve to the end plate 12. The output circuit is formed between the grid sleeve 20 and the tubular body 10 from the end plate 46 to the output probe 22.

Figure 6:
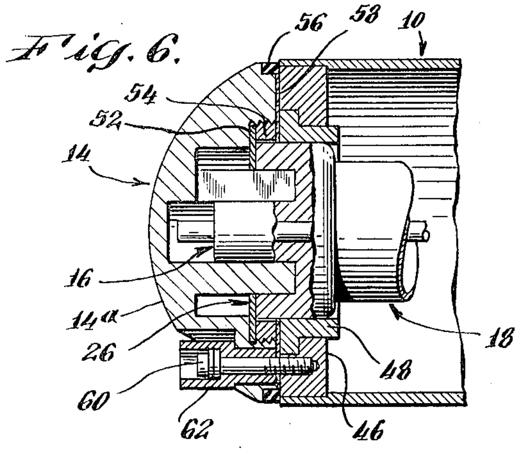
FIGURE 6 is a partial side view in section taken along lines 6—6 of FIGURE 5 looking in the direction of the arrows.
Figure 5:
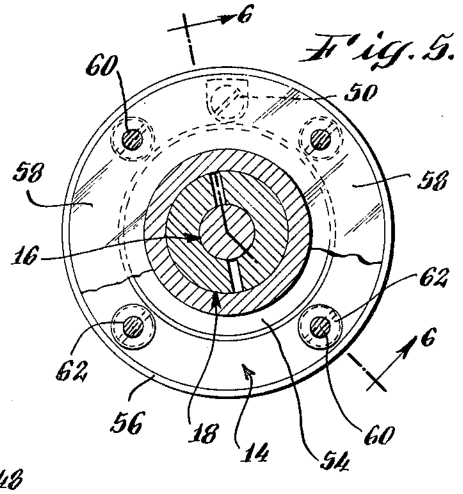
FIGURE 5 is an end view in section taken along lines 5—5 of FIGURE 2 looking in the direction of the arrows.
Figure 7:
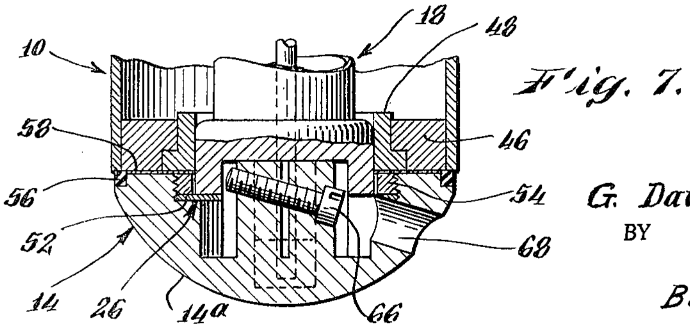
FIGURE 7 is a partial top view in section taken along line 7—7 of FIGURE 3 looking in the direction of the arrows.

As shown in FIGURES 5–7, the end cap 14 receives the anode terminal 26 with the flange 52 thereof seated tightly against the cap itself. An insulating ring 54 faces flange 52 from insulating sleeve 48 when assembled. The cap 14 is insulated at its periphery by an insulating ring 56 and a thin insulating disc 58 which is preferably of mica. The mica insulating disc 58 is a good electrical insulator for frequencies substantially below radio frequency but will conduct a great amount of heat from the end cap 14 to the end plate 46 and then to the body shell 10 for dissipation through the oscillator mounting feet 28, 30. The insulating disc 58 should thus have a high dielectric constant and yet be made thin enough and of such a material so that it has a low thermal gradient thereacross.

Figure 3:
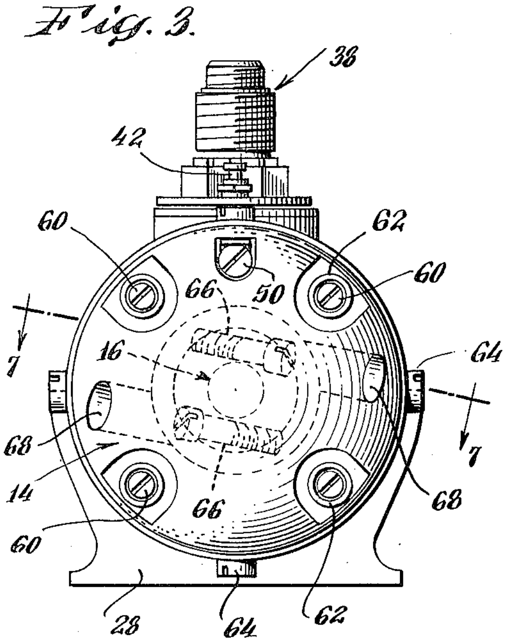
FIGURE 3 is an enlarged end view of the transmitting oscillator shown in FIGURE 1.

The end cap 14 is secured to the end plate 46 by screws 60 which are provided with insulating sleeves 62. As shown in FIGURE 2, end plate 46 is secured to the tubular body by screws 64 and is also preferably sealed with epoxy resin. As shown in FIGURES 3 and 7 the tube 18 is further secured against rotation by a pair of clamping screws 66 which may be tightened through openings 68 in the end cap.

The end cap 14 has a spherical outer surface **14*a* for maximum conduction of heat from the anode terminal with a minimum of weight. It has been found that heat from the central portion of the end cap travels in arcuate paths parallel to the outer surface 14*a* of the end cap. Cylindrical prior art end caps such as shown in dashed outline 70 in FIGURE 1 have added excess weight to the oscillator since the dashed line area 70 is of little value in conducting heat from the anodes. Thus the end cap 14 provides maximum heat conductivity from the anode terminal and through the insulating disc 58** while reducing anode cap weight to a minimum.

Referring now to FIGURES 2, 4, and 8, it will be seen that the coaxial grid sleeve 20 forms an integral part of the input and output circuits. The spatial relationship between the surfaces of the grid sleeve and the tubular body 10 and cathode line sub-assembly 36 are critical in determining oscillator frequency. As shown in FIGURE 4, a tuning element 72 has an end 74 which affects the spatial relationship between the grid sleeve 20 and the body shell 10 as it is moved toward and away from the grid sleeve. The oscillator can thus be tuned to the desired frequency by adjustment of tuning element 72 to vary the distributive capacitance and inductance of the oscillator.

Tuning element 34 similarly coacts with the bimetallic strip 32 to effect frequency control. The screw element 34 is located directly opposite tuning element 72 to maintain as much symmetry as possible about the grid sleeve. As shown in FIGURE 8, the bimetallic strip 32 is secured to the grid sleeve by rivets 76 and is spaced from the grid sleeve to automatically compensate for changes in oscillator spatial relationships due to temperature changes. The free end 78 of the bimetallic strip is preferably in line with the end 24 of the grid sleeve. Tuning element 34 is threaded into body extension 80 and is preferably provided with a locking nylon insert 82 for maintaining its preset position against vibration. End 84 of the tuning element is provided with a thin nylon cap 86 to prevent inadvertent shorting of the tuning element against the bimetallic strip 32. A similar thin cap 88 is provided on the end 74 of tuning element 72.

Prior to installation in a missile or space craft, the transmitting oscillator may be tested in an environmental chamber wherein the mounting feet 28, 30 are connected to conduct heat away from the oscillator body under simulated operating conditions. With the tube thus operating in the ambient temperatures to be encountered in space, the tuning elements 72 and 34 are adjusted to give the desired output frequency at the ambient operating temperatures of the oscillator. The temperature may be varied over the range of temperatures at which the oscillator will operate and further adjustment of tuning element 34 may be necessary to keep the output frequency within predetermined limits for a specified temperature range. Thus each transmitting oscillator can be pretested for heat dissipation and conduction from its anode end cap and its temperature compensating strip closely adjusted for the temperatures at which it is to operate in combination with a given anode end cap.

It should be understood that although a transmitting oscillator has been used as an example, the invention may be applied to a number of high frequency electronic devices wherein temperature affects distributive capacitive and inductive values.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

Having described my invention, what I claim as new and desire to secure by Letters Patent is:

1. A high frequency electronic device having distributed capacitance and inductance comprising, in combination,
 (A) a tubular body having
  (1) heat conducting mounting means adjacent the ends thereof,
 (B) an end gap on said body comprising
  (1) a spherical segment of heat conducting material and having
  (2) means therein for receiving an anode in heat transmitting relationship, and
 (C) a thin annular spacer between said body and said end cap,
  (1) said spacer having a high dielectric constant and
  (2) a low thermal gradient thereacross from said end cap to said body whereby heat generated by an anode is conducted to said end cap and then to said body through said spacer for dissipation through said mounting means while said spacer electrically insulates said end cap from said body at frequencies below radio frequency.

2. A high frequency electronic device having distributed capacitance and inductance comprising, in combination,
 (A) a tubular body having
  (1) heat conducting mounting means adjacent the ends thereof,
 (B) an end cap on said body comprising
  (1) a spherical segment of heat conducting material and having
  (2) means therein for receiving an anode in heat transmitting relationship, and
 (C) a thin annular mica spacer between said body and said end cap,
  (1) said spacer having a high dielectric constant and
  (2) a low thermal gradient thereacross from said end cap to said body whereby heat generated by an anode is conducted to said end cap and then to said body through said spacer for dissipation through said mounting means while said spacer electrically insulates said end cap from said body at frequencies below ratio frequency.

3. A microwave electronic device having distributed capacitance and inductance dependent upon the spatial relationship of electrodes and associated elements, comprising in combination,
 (A) a tubular body shell
  (1) having a longitudinal axis
  (2) with the electrodes symmetrically arranged about said axis
  (3) exterior mounting means adjacent the ends of said tubular body
 (B) an end cap on said body shell in the shape of a convex solid of revolution about said axis having
  (1) means therein for receiving an anode in heat transmitting relationship,
 (C) a thin annular spacer between said body shell and said end cap,
  (1) said spacer having a high dielectric constant and
  (2) a low thermal gradient thereacross from said end cap to said body,
 (D) a temperature compensator comprising
  (1) a bimetallic strip in said body and
  (2) positioned electrically between two of the electrodes, and
 (E) compensator adjusting means
  (1) extending through said body and
  (2) terminating adjacent said strip,
  (3) said compensator adjusting means being movable toward and away from said bimetallic strip whereby the frequency of said microwave component is maintained within a predetermined range by conduction of anode heat from said end cap through said spacer and then through said body and said mounting means, and said temperature compensator is adjusted from outside said body by positioning of said adjusting means with respect to said bimetallic strip.

4. A microwave electronic device having distributed capacitance and inductance dependent upon the spatial relationship of electrodes and associated elements, comprising in combination,
 (A) a tubular body shell
  (1) having a longitudinal axis
  (2) with the electrodes symmetrically arranged about said axis
  (3) exterior mounting means adjacent the ends of said tubular body
 (B) an end cap on said body shell in the shape of a convex solid of revolution about said axis having
  (1) means therein for receiving an anode in heat transmitting relationship,
 (C) a thin annular mica spacer between said body shell and said end cap,
  (1) said spacer having a high dielectric constant and
  (2) a low thermal gradient thereacross from said end cap to said body,
 (D) a temperature compensator comprising
  (1) a bimetallic strip in said body and
  (2) positioned electrically between two of the electrodes, and
 (E) compensator adjusting means
  (1) extending through said body and
  (2) terminating adjacent said strip,
  (3) said compensator adjusting means being movable toward and away from said bimetallic strip whereby the frequency of said microwave component is maintained within a predetermined range by conduction of anode heat from said end cap through said spacer and then through said body and said mounting means, and said temperature compensator is adjusted from outside said body by positioning of said adjusting means with respect to said bimetallic strip.

5. A microwave electronic device having distributed capacitance and inductance dependent upon the spatial relationship of electrodes and associated elements, comprising in combination,
 (A) a tubular body shell
  (1) having a longitudinal axis
  (2) with the electrodes symmetrically arranged about said axis
  (3) exterior mounting means adjacent the ends of said tubular body
 (B) an end cap on said body shell in the shape of a convex solid of revolution about said axis having
  (1) means therein for receiving an anode in heat transmitting relationship,
 (C) a thin annular mica spacer between said body shell and said end cap,
  (1) said spacer having a high dielectric constant and
  (2) a low thermal gradient thereacross from said end cap to said body,
 (D) a temperature compensator comprising
  (1) a bimetallic strip in said body and
  (2) positioned electrically between two of the electrodes, and
 (E) a probe element
  (1) threadably engaging and extending through said body and
  (2) terminating adjacent said strip,
  (3) said probe element being movable toward and away from said bimetallic strip whereby the frequency of said microwave component is maintained within a predetermined range by conduction of anode heat from said end cap through said spacer and then through said body and said mounting means, and said temperature compensator is adjusted from outside said body by positioning of said probe element with respect to said bimetallic strip.

6. In a high frequency electronic device having distributed capacitance and inductance forming parts of operating circuits the combination of (A) a metallic heat conducting cap forming a part of the device,
  (1) said cap being shaped as a convex solid of revolution and having
  (2) means for receiving a heat generating element therein,
(B) a spacer between said cap and the remainder of the device,
  (1) said spacer being an electrical insulator at frequencies below radio frequency and having
  (2) a low thermal gradient thereacross, and
(C) mounting means on the device connected to a heat sink, whereby heat generated by said device is conducted to said cap and then through said spacer to said mounting means and to said heat sink.

7. In a high frequency electronic device having distributed capacitance and inductance forming parts of operating circuits the combination of (A) a bimetallic strip
  (1) positioned between two conductors in the device to alter the spatial relationship therebetween with temperature changes of the device,
(B) tuning element means positioned adjacent said bimetallic strip for varying the distributed capacitance and inductance of the device, and
(C) means for varying said tuning element position from outside said device while said device is operating whereby said tuning element may be moved toward and away from said bimetallic strip for adjusting the distributed capacitance and inductance thereof.

8. In a transmitting oscillator having distributed capacitance and inductance as part of the operating circuits thereof, the combination of (A) a tubular body having
  (1) a longitudinal axis,
  (2) and heat conducting mounting means adjacent the ends thereof,
(B) a heat conducting end cap at one end of said body comprising
  (1) a spherical segment of heat conducting material having
  (2) means therein for receiving an anode in heat transmitting relationship,
(C) a thin annular spacer between said body and said end cap
  (1) said spacer having a high dielectric constant for frequencies substantially below radio frequency and
  (2) a low thermal gradient thereacross from said end cap to said body,
(D) a high frequency tube positioned in said end cap and extending inside said body,
  (1) and having its longitudinal axis coaxial with the longitudinal axis of said body,
(E) a grid sleeve mounted on said tube and extending longitudinally therefrom,
  (1) the longitudinal axis of said grid sleeve being coaxial with the longitudinal axis of said body,
(F) a bimetallic strip positioned between said body and said grid sleeve for movement therebetween with changes in temperature, (G) and a tuning element positioned adjacent said bimetallic strip,
  (1) said tuning element extending through and threadably engaging said body, whereby heat is removed from the anode of said tube through said end cap and is conducted through said body to said mounting means across said spacer, and the effect of said bimetallic strip upon the distributed capacitance and inductance between said grid sleeve and said body may be varied by moving said tuning element toward or away from said bimetallic strip.

9. In a high frequency electronic device having distributed capacitance and inductance forming parts of operating circuits the combination of (A) a metallic heat conducting cap forming a part of the device having
  (1) means contacting a heat generating element in heat conducting relationship,
(B) a spacer between said cap and the remainder of the device,
  (1) said spacer being an electrical insulator at frequencies below radio frequency and having
  (2) a low thermal gradient thereacross,
(C) mounting means on the device connected to a heat sink,
  (1) said mounting means being electrically insulated from said cap by said spacer, and
(D) a bimetallic strip
  (1) positioned in said device to affect distributed capacitance and inductance between parts thereof whereby heat generated by said device is conducted from said cap through said spacer to said mounting means and to said heat sink to maintain the temperature of the device within operating limits and said bimetallic strip compensates for changes in spatial relationships of parts of the device within the temperature operating limits.

10. In a high frequency electronic device having distributed capacitance and inductance forming parts of operating circuits the combination of (A) a metallic heat conducting cap forming a part of the device having
  (1) means contacting a heat generating element in heat conducting relationship,
(B) a spacer between said cap and the remainder of the device,
  (1) said spacer being an electrical insulator at frequencies below radio frequency and having
  (2) a low thermal gradient thereacross,
(C) mounting means on the device connected to a heat sink,
  (1) said mounting means being electrically insulated from said cap by said spacer,
(D) a bimetallic strip
  (1) positioned in said device to affect distributed capacitance and inductance between parts thereof,
(E) a tuning element positioned adjacent said bimetallic strip and
  (1) means for moving said tuning element relative to said bimetallic strip from outside the device whereby heat generated by said device is conducted from said cap through said spacer to said mounting means and to said heat sink to maintain the temperature of the device within operating limits and said bimetallic strip compensates for changes in spatial relationships of parts of the device within the temperature operating limits.

References Cited by the Examiner

UNITED STATES PATENTS

| | | | |
|---|---|---|---|
| 2,994,042 | 7/1961 | Power et al. | 331—98 |
| 3,173,106 | 3/1965 | McCulloch | 331—98 |

ROY LAKE, *Primary Examiner.*

S. H. GRIMM, *Assistant Examiner.*